(12) United States Patent
Gruber et al.

(10) Patent No.: US 10,855,300 B2
(45) Date of Patent: Dec. 1, 2020

(54) DIGITAL-TO-ANALOG CONVERTER (71) Applicant: MaxLinear, Inc., Carlsbad, CA (US)

(72) Inventors: Daniel Gruber, St. Andrae (AT); Franz Kuttner, St. Ulrich (AT); Davide Ponton, Warmbad-Villach (AT); Kameran Azadet, San Ramon, CA (US); Hundo Shin, Santa Clara, CA (US); Martin Clara, Santa Clara, CA (US); Matej Kus, Ljubljana (SI)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 16/369,276

(22) Filed: Mar. 29, 2019

(65) Prior Publication Data
US 2020/0313684 A1 Oct. 1, 2020

(51) Int. Cl.
*H03M 1/06* (2006.01)
*H04B 1/04* (2006.01)

(52) U.S. Cl.
CPC ............ *H03M 1/0612* (2013.01); *H04B 1/04* (2013.01)

(58) Field of Classification Search
CPC .......... H03M 1/742; H03M 1/66; H03M 1/74; H03M 1/785; H03M 1/802; H03M 1/808; H03M 1/685
See application file for complete search history.

(56) References Cited

U.S. PATENT DOCUMENTS

| | | | | |
|---|---|---|---|---|
| 5,714,953 A * | 2/1998 | Mitani | .................. | H03M 1/687 341/144 |
| 6,096,591 A * | 8/2000 | Gardner | .................. | H01L 28/20 257/350 |
| 6,259,745 B1 * | 7/2001 | Chan | ........................ | H04B 3/23 370/294 |
| 6,411,273 B1 * | 6/2002 | Nakamura | ........... | G09G 3/2011 345/205 |
| 6,873,278 B1 * | 3/2005 | Ferguson, Jr. | ........ | H03M 1/682 341/144 |
| 7,504,979 B1 * | 3/2009 | Knausz | ............... | H03M 1/0648 341/141 |

(Continued)

FOREIGN PATENT DOCUMENTS

WO  2014038197 A1  3/2014

OTHER PUBLICATIONS

Extended European Search Report in European Application 201601135 dated Aug. 24, 2020.

(Continued)

*Primary Examiner* — Aristocratis Fotakis
(74) *Attorney, Agent, or Firm* — Maschoff Brennan (57) ABSTRACT

A digital-to-analog converter is provided. The digital-to-analog converter includes a plurality of digital-to-analog converter cells coupled to an output node of the digital-to-analog converter. At least one of the plurality of digital-to-analog converter cells includes a capacitive element configured to generate an analog cell output signal based on a drive signal. The at least one of the plurality of digital-to-analog converter cells further includes a driver circuit configured to generate the drive signal, and a resistive element exhibiting a resistance of at least 20Ω. The resistive element is coupled between the driver circuit and the capacitive element or between the capacitive element and the output node.

25 Claims, 7 Drawing Sheets

(56) References Cited

U.S. PATENT DOCUMENTS

| | | | | |
|---|---|---|---|---|
| 8,674,867 B1* | 3/2014 | Klepser | ............... | H01F 21/12 |
| | | | | 341/144 |
| 8,854,242 B1* | 10/2014 | Klepser | ............... | H04B 7/0413 |
| | | | | 341/144 |
| 9,432,036 B1* | 8/2016 | Lowney | ............ | H03K 17/04106 |
| 9,831,833 B1* | 11/2017 | Xie | ............... | H03F 1/0205 |
| 2003/0020544 A1* | 1/2003 | Behzad | ............... | H01F 17/0006 |
| | | | | 330/254 |
| 2007/0146187 A1* | 6/2007 | Chia | ............... | G09G 3/3696 |
| | | | | 341/144 |
| 2008/0198053 A1* | 8/2008 | Tsang | ............... | H03M 1/0678 |
| | | | | 341/144 |
| 2009/0278626 A1* | 11/2009 | Lee | ............... | H03H 7/0115 |
| | | | | 333/185 |
| 2012/0286983 A1* | 11/2012 | Pfann | ............... | H03D 7/1466 |
| | | | | 341/144 |
| 2013/0271305 A1* | 10/2013 | Kim | ............... | H03M 1/785 |
| | | | | 341/143 |
| 2013/0293405 A1* | 11/2013 | Medina Sanchez-Castro | ............. | |
| | | | | H03M 1/785 |
| | | | | 341/154 |
| 2014/0070973 A1* | 3/2014 | Chiu | ............... | H03D 7/1441 |
| | | | | 341/150 |
| 2014/0146913 A1* | 5/2014 | Kuttner | ............... | H03M 1/66 |
| | | | | 375/295 |
| 2016/0094235 A1* | 3/2016 | Kuttner | ............... | H03M 1/662 |
| 2016/0173032 A1* | 6/2016 | Kuttner | ............... | H03F 1/0205 |
| | | | | 375/297 |
| 2016/0182080 A1* | 6/2016 | Vasani | ............... | H03M 1/1028 |
| | | | | 341/145 |
| 2019/0036541 A1* | 1/2019 | Wong | ............... | H03M 1/747 |
| 2019/0068179 A1 | 2/2019 | Chen et al. | | |

OTHER PUBLICATIONS

BATISTELL et al., "SCPA non-linearity Modelling and Analysis" 2018 International Workshop on on Integrated Nonlinear Microwave and Millimetre-Wave Circuits (INMMIC), IEEE, Jul. 5, 2018 Doi: 10.1109/1NMM10.2018.8429993.

* cited by examiner

DIGITAL-TO-ANALOG CONVERTER

FIELD

The present disclosure relates to digital-to-analog conversion. In particular, examples relate to Digital-to-Analog Converters (DACs), a transmitter, a base station and a mobile device.

BACKGROUND

Modern transmitters use DACs in order to convert digital transmit data to analog signals for radiation to the environment or injection into a waveguide medium such as a cable. The requirements for transmitters are getting tougher with each new communication standard.

DACs use driver circuits such as inverter circuits or logic circuits (e.g. a NAND gate, a NOR gate or combinations thereof) to drive output signals of the individual DAC cells. A driver circuit generally exhibits a non-linear output impedance, which may depend on the data input to the driver circuit. For example, if the driver circuit is implemented in Metal-Oxide-Semiconductor (MOS)-technology, the aspect that the on-resistance of the inverter's NMOS (n-type MOS)-components is not exactly equal to the on-resistance of the inverter's PMOS (p-type MOS)-components may lead to a non-linear output impedance of the driver circuit. Accordingly, a linearity of the DAC may suboptimal.

Hence, there may be a desire for an improved DAC architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
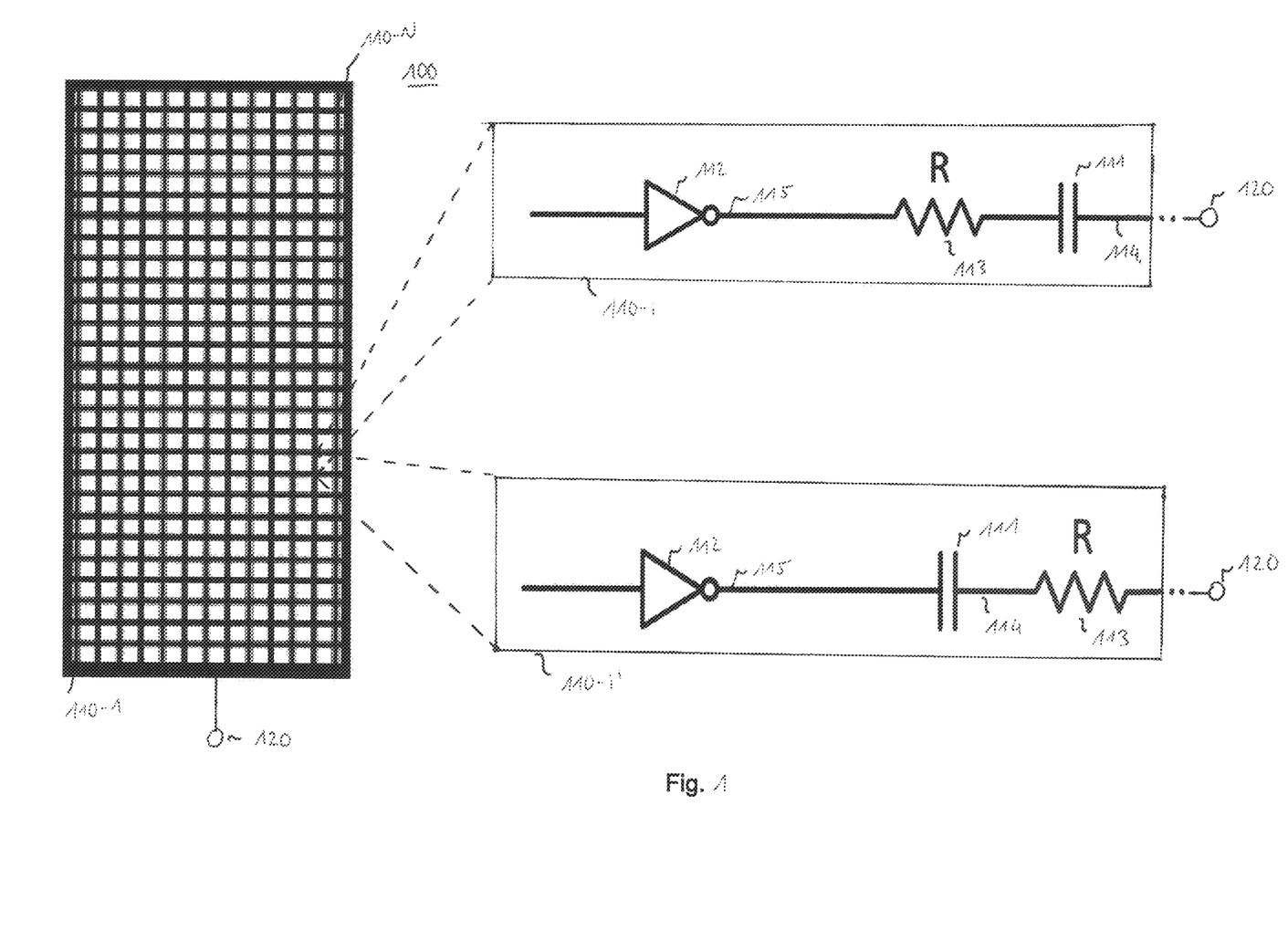
FIG. 1 illustrates a first example of a DAC.

FIG. 1 illustrates an example of a DAC 100 that may allow to increase the linearity of the DAC. The DAC 100 comprises a plurality of DAC cells 110-1, . . . , 110-N. The plurality of DAC cells 110-1, . . . , 110-N may be any number N≥2 of DAC cells (e.g. related to a desired resolution of the DAC). The plurality of DAC cells 110-1, . . . , 110-N are coupled to an output node 120 of the DAC 100. Although the proposed DAC cell architecture is described below with respect to the plurality of DAC cells 110-1, . . . , 110-N, it is to be noted that the proposed DAC cell architecture may as well be used for a DAC comprising only one DAC cell.

In FIG. 1, two exemplary implementations for at least one of the plurality of DAC cells 110-1, . . . , 110-N are illustrated. The two exemplary DAC cells are denoted by reference numerals 110-i and 110-i'. Any of the plurality of DAC cells 110-1, . . . , 110-N may be implemented like one of the DAC cells 110-i and 110-i'.

Both exemplary DAC cells 110-i and 110-i' comprise a capacitive element 111 configured to generate an analog cell output signal 114 based on a drive signal 115. For example, the capacitive element 111 may be an on-chip capacitor (e.g. implemented within metal layers or by trenches within a semiconductor substrate). However, the capacitive element 111 may also be any other suitable means for providing a capacitance. The capacitive element 111 may, e.g., exhibit a capacitance ranging from a few picofarad to a few attofarad.

The plurality of DAC cells 110-1, . . . , 110-N are coupled to the output node 120 of the DAC 100 so that their analog cell output signals sum up to an analog output signal of the DAC 100.

Further, both exemplary DAC cells 110-i and 110-i' comprise a driver circuit 112 configured to generate the drive signal 115 for the capacitive element 111. For example, the driver circuit 112 may be an inverter circuit or a logic circuit (e.g. a NAND gate, a NOR gate, any other logic gate, or a combination thereof). In the example of FIG. 1, the driver circuit 112 is implemented as an inverter circuit. The driver circuit 112 is configured to receive a signal, and to invert the signal in order to generate the drive signal 115.

The exemplary DAC cells 110-*i* and 110-*i'* additionally comprise a resistive element 113 exhibiting a resistance of at least 20Ω. In other words, an element with a high resistance (compared to, e.g., a conductive trace/path coupling the driver circuit 112 and the capacitive element 111 or a conductive trace/path coupling the capacitive element 111 and the output node 120) is arranged within the DAC cell downstream of the driver circuit 112. The resistive element 113 is a dedicated physical component that is different from a conductive trace/path coupling the driver circuit 112 and the capacitive element 111 or a conductive trace/path coupling the capacitive element 111 and the output node 120.

In DAC cell 110-*i*, the resistive element 113 is coupled between the driver circuit 112 and the capacitive element 111. In the alternative implementation of DAC cell 110-*i'*, the resistive element 113 is coupled between the capacitive element 111 and the output node 120 of the DAC 100.

The resistive element 113 may allow to desensitize the DAC 100 with respect to the resistance variations within the driver circuit 112. In other words, the resistive element 113 may reduce the impact of the driver circuit 112's non-linear output impedance on the linearity of the DAC 100. Accordingly, providing the linear resistive element 113 in the DAC cells 110-*i* and 110-*i'* may allow to linearize the output stage of the DAC cells 110-*i* and 110-*i'*.

In some example, the resistance of the resistive element 113 may be higher than 20Ω. For example, the resistance of the resistive element 113 may be at least 50Ω, 70Ω, 100Ω, 200Ω, 300Ω 400Ω, 500Ω, 1000Ω, 1500Ω, 2000Ω, 2500Ω, 3000Ω, 3500Ω, 4000Ω, 5000Ω, 6000Ω or 7000Ω. A higher resistance of the resistive element 113 results in increased linearity of the DAC cells 110-*i* and 110-*i'*. Accordingly, a linearity of the DAC 100 may be increased by selecting a higher resistance value for the resistive element 113.

The resistive element 113 may be implemented in many different ways. For example, the resistive element 113 may be a thin film resistor or a polysilicon resistor. In order to accommodate a suitable resistance range (e.g. several ten Ohms to a few kilo-Ohm) in a compact layout footprint, the resistive element 113 may be made out of a medium to high sheet resistance material (e.g. polysilicon). In other examples, the resistive element 113 may be a metal resistor (e.g. a meandering shaped metal trace).

In the example of FIG. 1, n≤N DAC cells out of the plurality of DAC cells 110-1, . . . , 110-N may be identical to one of the DAC cells 110-*i* and 110-*i'*. In some examples, all DAC cells of the plurality of DAC cells 110-1, . . . , 110-N may be identical to one of the DAC cells 110-*i* and 110-*i'*. In other examples, one or more DAC cells of the plurality of DAC cells 110-1, . . . , 110-N may differ from the DAC cells 110-*i* and 110-*i'* (e.g. comprise additional, less or different elements).

Figure 2:
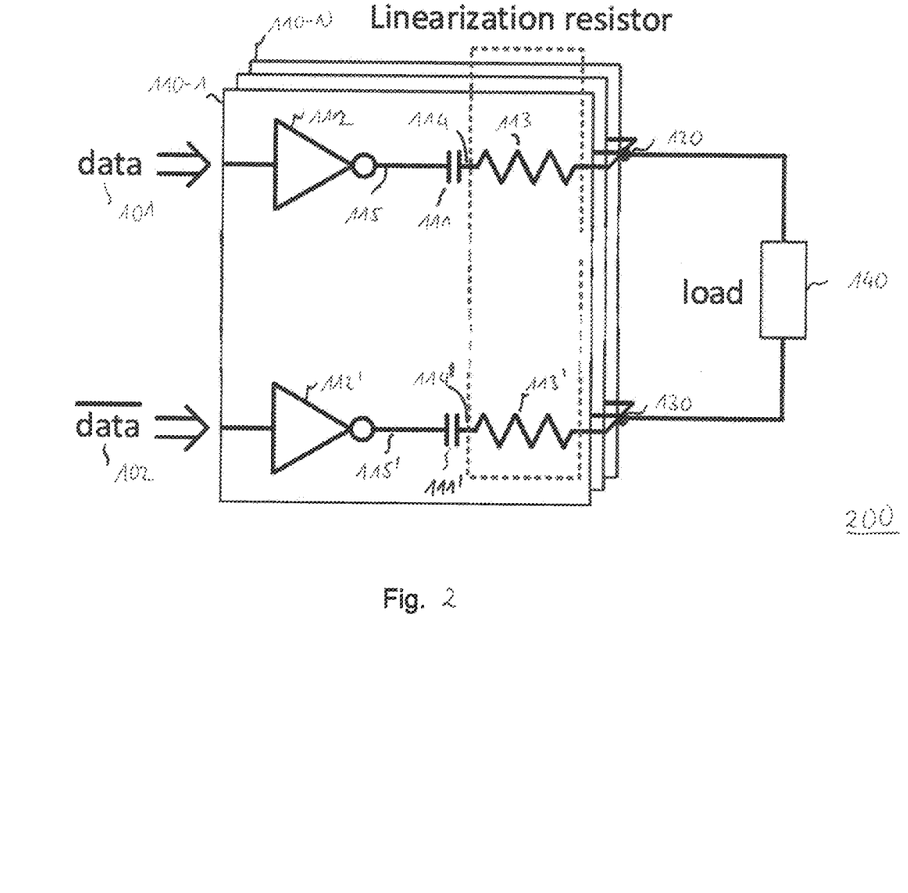
FIG. 2 illustrates a second example of a DAC.

The above described DAC 100 is a single-ended implementation of the proposed DAC architecture. An example of a differentially implemented DAC according to the proposed architecture is illustrated in FIG. 2. FIG. 2 illustrates a DAC 200 comprising a plurality of DAC cells 110-1, . . . , 110-N.

As described above for DAC 100, the exemplary DAC cell 110-1 comprises a (first) capacitive element 111 configured to generate an (first) analog cell output signal 114 based on a (first) drive signal 115. Further, the DAC cell 110-1 comprises a (first) driver circuit 112 configured to generate the drive signal 115. A (first) resistive element 113 exhibiting a resistance of at least 20Ω is coupled between the capacitive element 111 and a (first) output node 120 of the DAC 200.

Further, the exemplary DAC cell 110-1 comprises a second capacitive element 111' configured to generate a second analog cell output signal 114' based on a second drive signal 115'. The exemplary DAC cell 110-1 additionally comprises a second driver circuit 112' configured to generate the second drive signal 115'. The second drive signal 115' is inverted with respect to the drive signal 115. A second resistive element 113' is coupled between the second capacitive element 111' and a second output node 130 of the DAC 200. A resistance of the second resistive element 111' is equal to the resistance of the resistive element 111.

In the example of FIG. 2, the driver circuits 112, 112' are implemented as inverter circuits. The driver circuit 112 is configured to receive a first digital signal 101 representing digital data, and to invert the first digital signal 101 in order to generate the drive signal 115. Similarly, the driver circuit 112' is configured to receive a second digital signal 102 representing inverted digital data, and to invert the second digital signal 102 in order to generate the second drive signal 112'. Since the data represented by the first and second digital signals 101 and 102 are inverted with respect to each other, the resulting analog cell output signals 114 and 114' of the DAC cell 110-1 are inverted with respect to each other.

Since the analog cell output signals 114 and 114' are inverted with respect to each other, the summed DAC output signals at the output nodes 120 and 130 form a differential signal pair.

However, it is to be noted that the implementation of the DAC cell 110-1 as illustrated in FIG. 2 is merely exemplary. The DAC cells of the DAC 200 may in some examples be implemented different from what is illustrated in FIG. 2 (e.g. comprises more, less or other components and/or receive more, less or different signals). For example, the DAC cell 110-1 may receive a modulated oscillation signal instead of the first digital signal 101.

Further illustrated in FIG. 2 is a load 140 coupled the output nodes 120 and 130 of the DAC 200. In the example of FIG. 2, the load 140 is illustrated as a resistor since any load presents an impedance to the DAC 200. For example, the load 140 may be a mixer for up-mixing one or both output signals of the DAC 200, a Power Amplifier (PA) for amplifying one or both output signals of the DAC 200, a filter for filtering one or both output signals of the DAC 200, or an antenna for radiating one or both output signals of the DAC 200 to the environment.

As described above in connection with FIG. 1, one or more DAC cells of the plurality of DAC cells may be implemented different from the above described DAC cells. For example, a DAC according to the proposed architecture may comprise a first number of thermometer coded DAC cells and a second number of binary coded DAC cells. While the thermometer coded DAC cells all exhibit the same drive strength, the drive strengths of the binary coded DAC cells are only fractions of the thermometer coded DAC cells' drive strength. An example of a binary coded DAC cell 310 is illustrated in FIG. 3.

Figure 3:
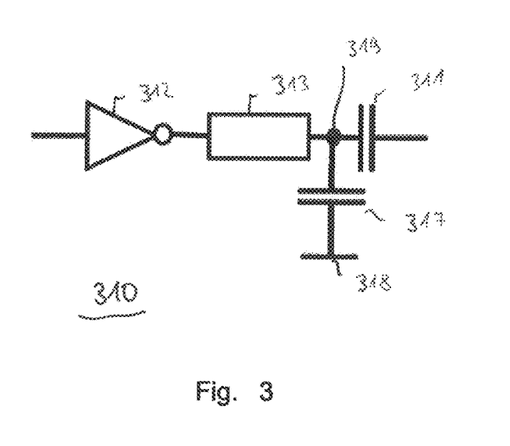
FIG. 3 illustrates an example of a DAC cell.

It can be seen from FIG. 3 that DAC cell 310 comprises a capacitive element 311, a driver circuit 312 and a resistive element 313 like e.g. DAC cell 110-*i* described above. It is to be noted that DAC cell 310 may optional comprise further elements such as a logic circuit described above.

In comparison to DAC cell 110-*i*, DAC cell 310 additionally comprises a further capacitive element 317 coupled between a first node 318 at ground potential and a second node 319 arranged between the driver circuit 312 and the capacitive element 311.

A summed capacitance of the further capacitive element 317 and the capacitive element 311 is equal to a capacitance of the capacitive element 111 of the DAC cell 110-$i$. In other words, the capacitance of the capacitive element 111 in the DAC cell 110-$i$ may be divided into a wanted capacitance (capacitive element 311) and a parasitic capacitance (further capacitive element 314) for adjusting a drive strength of the DAC cell 310 to a fraction of the DAC cell 110-$i$'s drive strength. For example, a capacitance of the capacitive element 311 may be ½, ¼, ⅛, 1/16, 1/32 or 1/64 of the capacitance of the capacitive element 111 in the DAC cell 110-$i$. Accordingly, a capacitance of the further capacitive element 314 may be ½, ¾, ⅞, 15/16, 31/32 or 63/64 of the capacitance of the capacitive element 111 in the DAC cell 110-$i$.

Since the summed capacitance of the further capacitive element 317 and the capacitive element 311 is equal to a capacitance of the capacitive element 111 of the DAC cell 110-$i$, the resistance of the resistive element 313 of the DAC cell 310 is equal to the resistance of the resistive element 113 of the DAC cell 110-$i$.

If the summed capacitance of the further capacitive element 317 and the capacitive element 311 is different from a capacitance of the capacitive element 111 of the DAC cell 110-$i$, a ratio of a resistance of the resistive element 313 of the DAC cell 310 to the resistance of the resistive element 113 of the DAC cell 110-$i$ may be equal to a ratio of the capacitance of the capacitive element 111 of the DAC cell 110-$i$ to the summed capacitance of the further capacitive element 317 and the capacitive element 311. In other words, the ratio of resistances in the DAC cells 110-$i$ and 310 may be inversely proportional to the ratio of the summed capacitance of DAC cell 310 to the single capacitance of DAC cell 110-$i$.

Referring back to DAC 100 illustrated in FIG. 1, the plurality of DAC cells 110-1, ..., 110-N may, e.g., comprise at least one DAC cell 110-$i$ as described above and at least one DAC cell 310 as described above. For example, DAC 100 may comprises 1024 thermometer coded DAC cells that are implemented like DAC cell 110-$i$ and 6 additional binary coded DAC cells that are implemented like DAC cell 310. For example, a respective capacitance of the six capacitive elements 311 may be ½, ¼, ⅛, 1/16, 1/32 and 1/64 of the individual capacitance of the 1024 capacitive elements 111.

Figure 4:
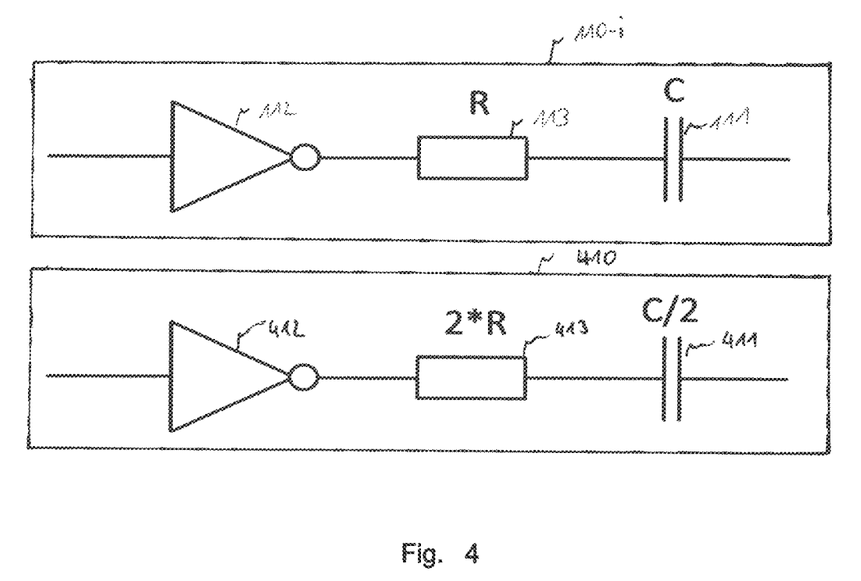
FIG. 4 illustrates an exemplary comparison between two DAC cells.

Another example of a DAC cell 410 exhibiting a reduced drive strength compared to DAC cell 110-$i$ described above is illustrated in FIG. 4. FIG. 4 illustrates a comparison between the DAC cells 110-$i$ and 410.

The DAC cell 110-$i$ comprises a driver circuit 112 coupled to a capacitive element 111. A resistive element 113 is coupled between the driver circuit 112 and the capacitive element 111.

Similarly, the DAC cell 410 comprises a driver circuit 412 coupled to a capacitive element 411. A resistive element 413 is coupled between the driver circuit 412 and the capacitive element 411.

The capacitive element 111 of the DAC cell 110-$i$ exhibits a capacitance C. In comparison to the DAC cell 110-$i$, the capacitive element 411 of the DAC cell 410 exhibits a capacitance different from the capacitance of the capacitive element 111. In the example of FIG. 4, the capacitance of the capacitive element 411 is C/2, i.e. half of the capacitance of the capacitive element 111. However, it is to be noted that the above values are merely exemplary and do not restrict the proposed architecture (e.g. the capacitance of the capacitive element may be C/4, C/8, C/16, etc. in some examples).

In order to compensate for the different capacitances, also the resistances of the resistive elements 113 and 413 are different from each other. In particular, the resistances of the resistive elements 113 and 413 may be inversely proportional to the capacitances of the capacitive elements 111 and 411. In the example of FIG. 4, the resistance of the resistive element 413 is therefore two time the resistance of the resistive element 113. In other words, a ratio of the resistance of the resistive element 413 of the DAC cell 410 to the resistance of the resistive element 113 of the DAC cell 110-$i$ is equal to a ratio of the capacitance of the capacitive element 111 of the DAC cell 110-$i$ to the capacitance of the capacitive element 411 of the DAC cell 410.

For example, the DAC cell 110-$i$ may be used as a thermometer coded DAC cell and the DAC cell 410 may be used as a binary coded DAC cell in a DAC according to the proposed architecture.

In the examples described above in connection with FIGS. 1 to 4, a single resistive element is used in the DAC cell for linearizing the output stage of the DAC cell. In the following, three examples using two resistive elements instead of only one will be described in connection with FIGS. 5 to 7.

Figure 5:
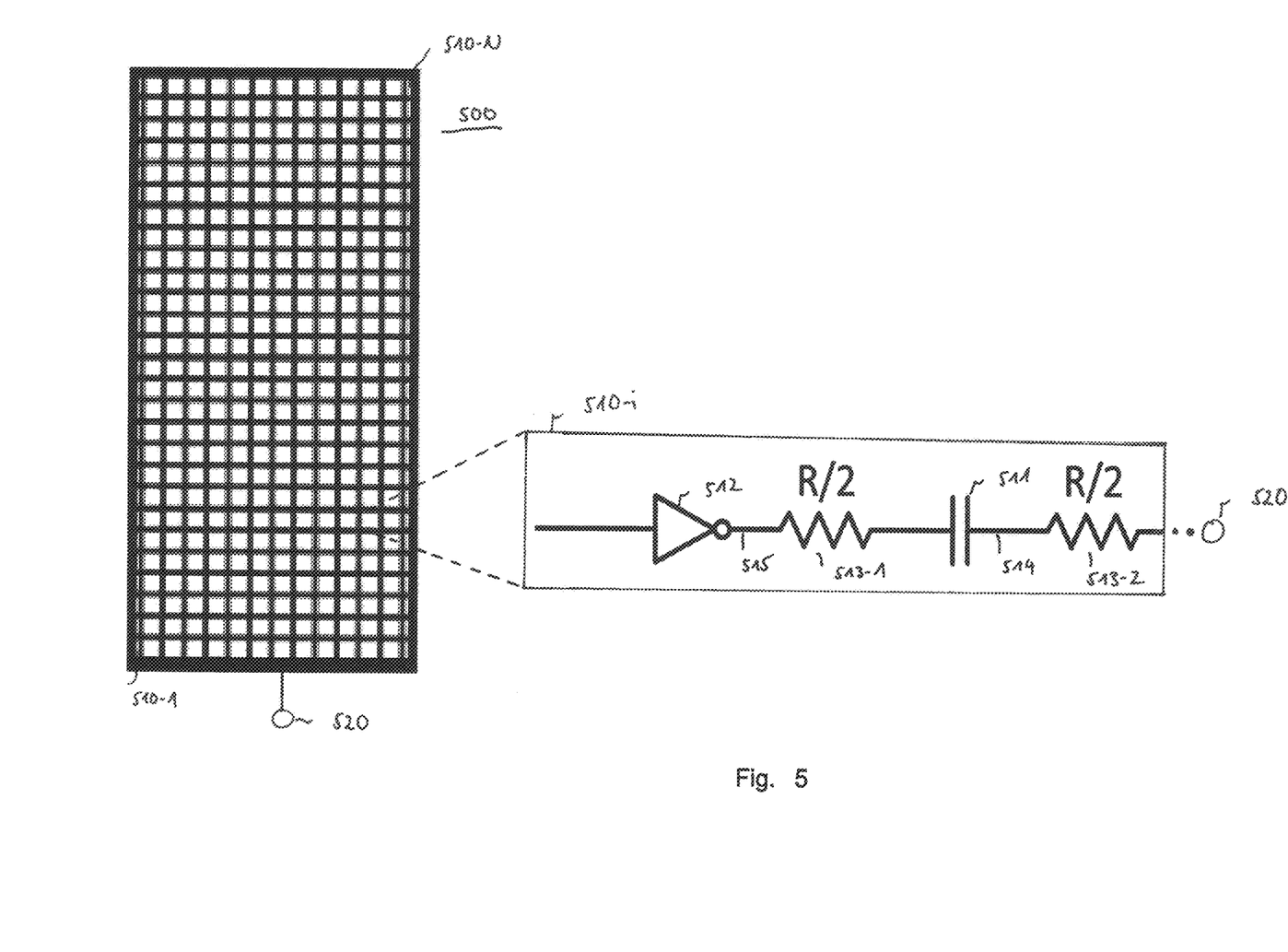
FIG. 5 illustrates a third example of a DAC.

FIG. 5 illustrates another DAC 500 comprising a plurality of DAC cells 510-1, ..., 510-N. As for the DACs described above, the plurality of DAC cells 510-1, ..., 510-N may be any number N≥2 of DAC cells (e.g. related to a desired resolution of the DAC). The plurality of DAC cells 510-1, ..., 510-N are coupled to an output node 520 of the DAC 500 so that their analog cell output signals sum up to an analog output signal of the DAC 500. Although the proposed DAC cell architecture is described below with respect to the plurality of DAC cells 510-1, ..., 510-N, it is to be noted that the proposed DAC cell architecture may as well be used for a DAC comprising only one DAC cell.

For illustrative purposes, a DAC cell 510-$i$ is illustrated in detail. The DAC cell 510-$i$ may be understood to be exemplary for one or more other DAC cells of the plurality of DAC cells 510-1, ..., 510-N.

Like the DAC cells described above in connection with FIGS. 1 to 4, the DAC cell 510-$i$ comprises a capacitive element 511 configured to generate an analog cell output signal 514 based on a drive signal 515. Further, the DAC cell 510-$i$ comprises a driver circuit 512 configured to generate the drive signal 515.

Contrary to the DAC cells described above in connection with FIGS. 1 to 4, the DAC cell 510-$i$ comprises a first resistive element 513-1 and a second resistive element 513-2, i.e. two resistive elements. The first resistive element 513-1 is coupled between the driver circuit 512 and the capacitive element 511. The second resistive element 513-2 is coupled between the capacitive element 511 and the output node 520. The first and the second resistive element exhibit a summed resistance of at least 20Ω. That is, two physical element with a high resistance (compared to, e.g., a conductive trace/path coupling the driver circuit 512 and the capacitive element 511 or a conductive trace/path coupling the capacitive element 511 and the output node 520) are arranged within the DAC cell for linearizing the cell output. In other words, the single resistive element used in the DAC cells described above in connection with FIGS. 1 to 4 is split up into two separate resistive elements in the example of FIG. 5. Similar to what is described above, the first resistive element 513-1 and the second resistive element 513-2 may allow to linearize the output stage of the DAC cell 510-$i$.

In the example of FIG. 5, the two resistive elements are arranged outside the driver circuit 512. However, in some alternative examples, the two resistive elements may be arranged within the driver circuit 512. Two examples for arranging the two resistive elements within the driver circuit 512 are described in the following with respect to FIGS. 6 and 7.

Figure 6:
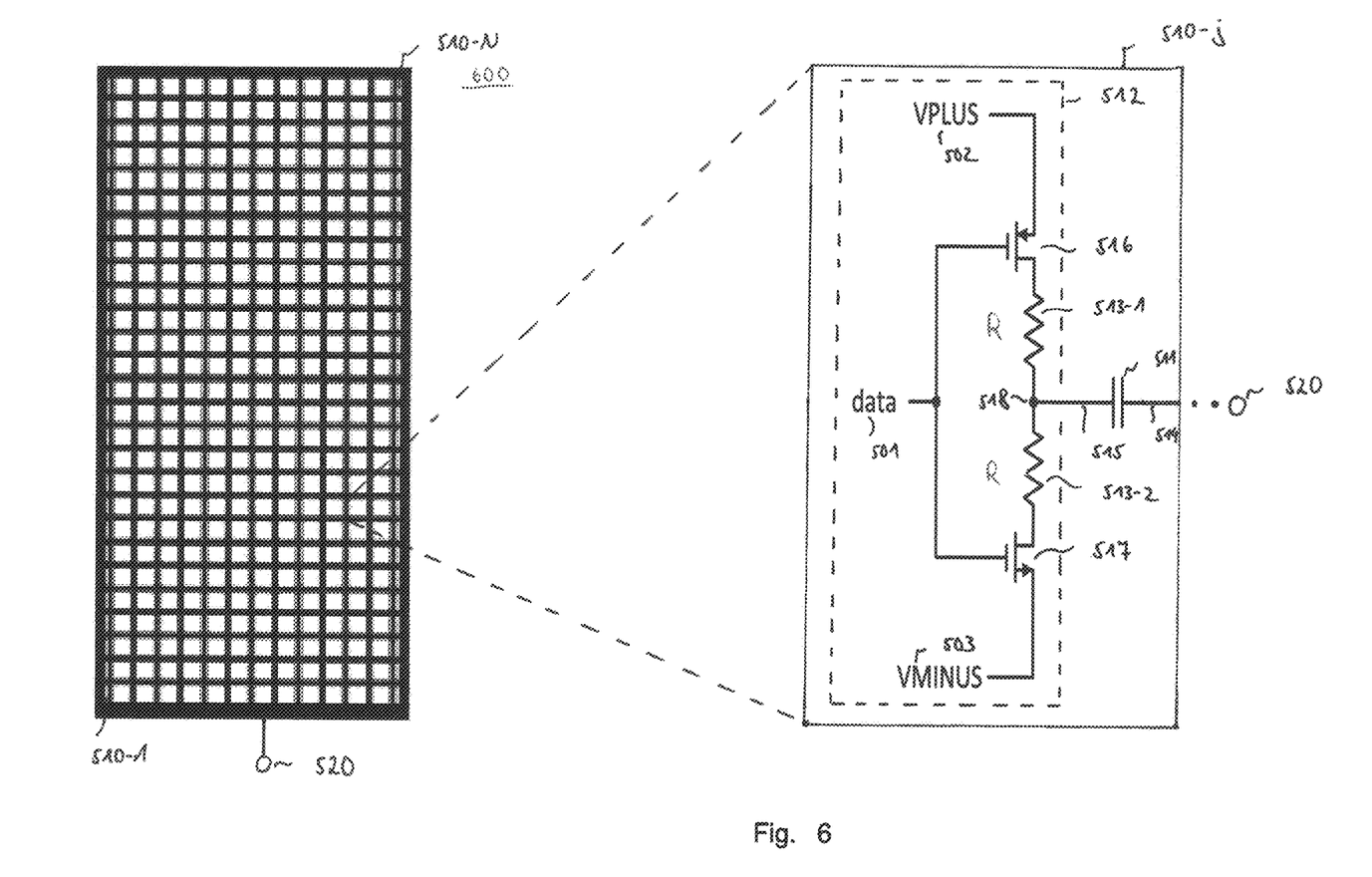
FIG. 6 illustrates a fourth example of a DAC.

FIG. 6 illustrates a DAC 600 comprising a plurality of DAC cells 510-1, ..., 510-N like the DAC 500. An exemplary DAC cell 510-*j* of DAC 600 is illustrated. The DAC cell 510-*j* comprises a capacitive element 511 configured to generate an analog cell output signal 514 based on a drive signal 515. Further, the DAC cell 510-*j* comprises a driver circuit 512 configured to generate the drive signal 515.

The driver circuit 512 (e.g. an inverter or a logic circuit) comprises at least two transistors 516 and 517 of different conductivity (e.g. an NMOS and a PMOS FET) serially coupled between a (first node at a) first potential 502 (e.g. a supply voltage $V_{dd}$) and a (second node at a) second potential 503 (e.g. ground or a supply voltage $V_{ss}$). An output node 518 of the driver circuit 512 for providing the drive signal 515 is coupled between the at least two transistors 516 and 517. Based on a digital signal 501 representing digital data, the two transistors 516 and 517 selectively couple the output node 518 of the driver circuit 512 to either the first potential 502 or the second potential 503 in order to generate the drive signal 515. It is to be noted that the digital signal 501 illustrated in FIG. 5 is merely exemplary. In some examples, other signals such as a modulated oscillation signal may be provided to the control terminals of the transistors. Further, the wiring of the transistor control terminals illustrated in FIG. 5 is merely exemplary. In some examples, different signals may be supplied to the control terminals of the transistors.

The first resistive element 513-1 is coupled between the output node 518 of the driver circuit 512 and the transistor 516 (i.e. a first one of the at least two transistors 516 and 517). The second resistive element 513-2 is coupled between the output node 518 of the driver circuit 512 and the transistor 517 (i.e. a second one of the at least two transistors 516 and 517). Each of the first resistive element 513-1 and the second resistive element 513-2 exhibits a resistance of at least 20Ω so that first and second resistive elements 513-1 and 513-2 exhibit a summed resistance of at least 40Ω.

Similar to the example of FIG. 5, the arrangement of the two resistive elements 513-1 and 513-2 may allow to linearize the impedance of the driver circuit 512 so that a linearity of the DAC 600 may be improved.

Figure 7:
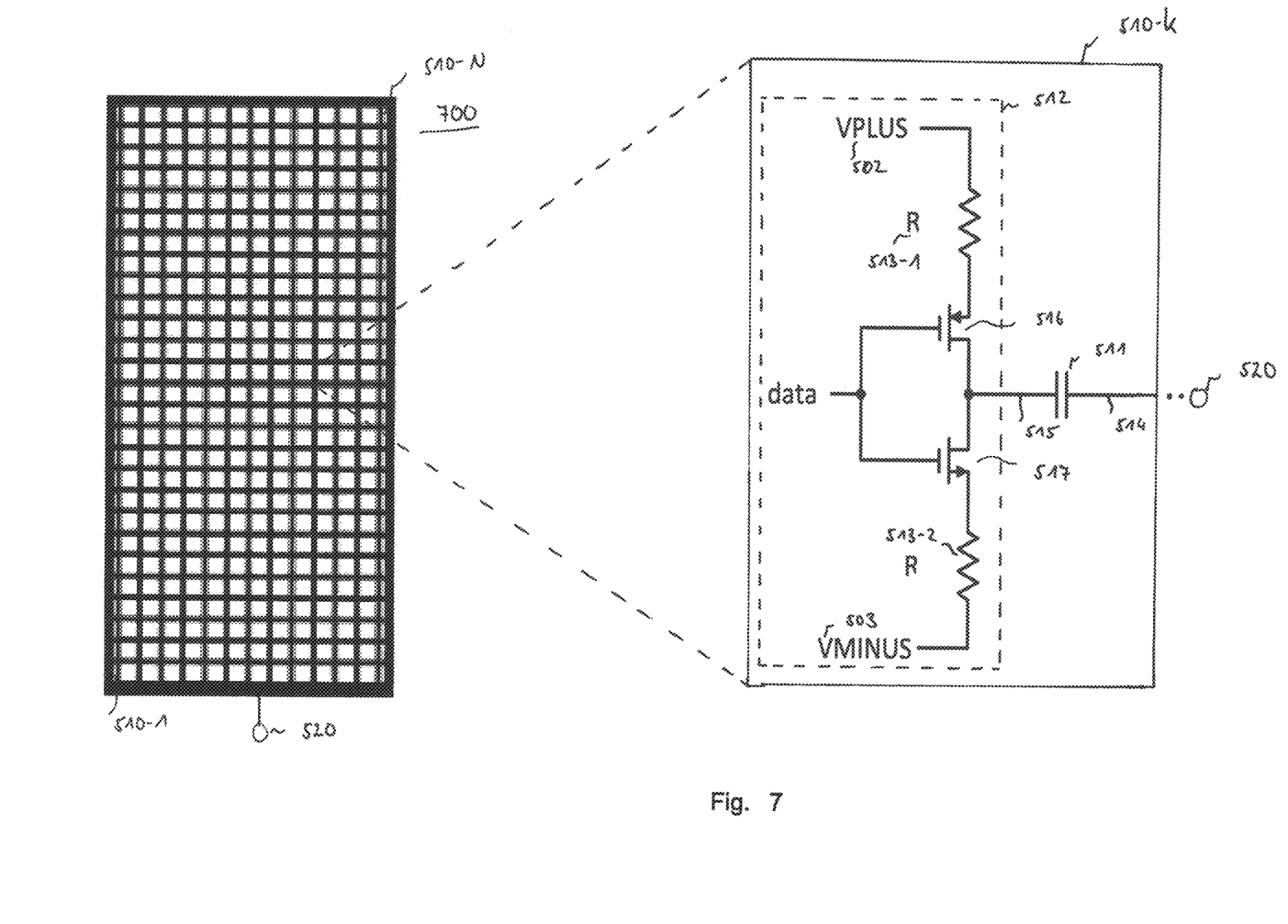
FIG. 7 illustrates a fifth example of a DAC.

An alternative arrangement of the two resistive elements 513-1 and 513-2 within the driver circuit 512 is illustrated in FIG. 7. FIG. 7 illustrates another exemplary DAC 700 comprising a plurality of DAC cells 510-1, ..., 510-N DAC like the DAC 600. An exemplary DAC cell 510-*k* of DAC 700 is illustrated. Compared to the DAC cell 510-*j*, the resistive elements are arranged between the transistors and the potentials but not between the transistors and the output node of the driver circuit.

In particular, the first resistive element 513-1 is coupled between the first potential 502 and the transistor 516 (i.e. a first one of the at least two transistors 516 and 517). The second resistive element 513-2 is coupled between second potential 503 and the transistor 517 (i.e. a second one of the at least two transistors 516 and 517). Each of the first resistive element 513-1 and the second resistive element 513-2 exhibits a resistance of at least 20Ω so that first and second resistive elements 513-1 and 513-2 exhibit a summed resistance of at least 40Ω.

Also the exemplary arrangement of the resistive elements 513-1 and 513-2 illustrated in FIG. 7 may allow to linearize the impedance of the driver circuit 512 so that a linearity of the DAC 700 may be improved.

As indicated in FIGS. 5 to 7, the first and the second resistive element 513-1 and 513-2 may exhibit the same resistance. In particular, each of the first and the second resistive element 513-1 and 513-2 may exhibit a resistance of at least 10Ω. In other words, each resistive elements 513-1 and 513-2 may be a physical component different from a conductive trace/path coupling the driver circuit 512 and the capacitive element 511, a conductive trace/path coupling the capacitive element 511 and the output node 520, or an internal conductive trace/path coupling components of the driver circuit 512.

The capacitive element 511, the driver circuit 512 (apart from the arrangement of the resistive elements 513-1 and 513-2 with the driver circuit) and the resistive elements 513-1 and 513-2 may be implemented substantially similar to what is described above for the capacitive element 111, the driver circuit 112 and the single resistive element 113 in connection with FIGS. 1 to 4.

For example, the summed resistance of the first and the second resistive element 513-1 and 513-2 may be higher than 20Ω. For example, the summed resistance of the first and the second resistive element 513-1 and 513-2 may be at least 50Ω, 70Ω, 100Ω, 200Ω, 300Ω 400Ω, 500Ω, 1000Ω, 1500Ω, 2000Ω, 2500Ω, 3000Ω, 3500Ω, 4000Ω, 5000Ω, 6000Ω or 7000Ω. A higher summed resistance of the first and the second resistive element 513-1 and 513-2 results in increased linearity of the DAC cells 510-*i*, 510-*j* and 510-*k*. Accordingly, a linearity of the DACs 500, 600 and 700 may be increased by selecting a resistance values for the resistive elements 513-1 and 513-2.

The resistive elements 513-1 and 513-2 may be implemented in many different ways. For example, at least one of the first and the second resistive element 513-1 and 513-2 may be a thin film resistor or a polysilicon resistor. In order to accommodate a suitable resistance range (e.g. several ten Ohms to a few kilo-Ohm) in a compact layout footprint, the resistive elements 513-1 and 513-2 may be made out of a medium to high sheet resistance material (e.g. polysilicon). In other examples, at least one of the first and the second resistive element 513-1 and 513-2 may be a metal resistor (e.g. a meandering shaped metal trace).

In some examples, n≤N DAC cells out of the plurality of DAC cells may be identical to one of the DAC cells 510-*i*, 510-*j* and 510-*k* in the respective DAC 500, 600 or 700. For example, all DAC cells of the DAC 500, 600 or 700 may be identical to one of the DAC cells 510-*i*, 510-*j* and 510-*k*. In other examples, one or more DAC cells of the DAC 500, 600 or 700 may different from the DAC cells 510-*i*, 510-*j* and 510-*k* (e.g. comprise additional, less or different elements).

Similarly to what is described above in connection with FIG. 3, each of the DACs 500, 600 and 700 may comprise a first number of thermometer coded DAC cells and a second number of binary coded DAC cells. For example, thermometer coded DAC cells may be implemented like one of the DAC cells 510-*i*, 510-*j* and 510-*k*. In comparison to the DAC cells 510-*i*, 510-*j* and 510-*k*, the one or more other DAC cells used as binary coded DAC cells may, e.g., additionally comprises a further capacitive element coupled between a first node at ground potential and a second node arranged between the driver circuit and the capacitive element of the other DAC cell.

A summed capacitance of the further capacitive element and the capacitive element of the other DAC cell may be equal to a capacitance of the capacitive element 511 of the DAC cells 510-*i*, 510-*j* or 510-*k*. Accordingly, a summed resistance of the resistive elements of the other DAC cell may be equal to the summed resistance of the resistive elements of the DAC cell **510-*i*, or be half of the summed resistance of the resistive elements of the DAC cell 510-*j* or 510-*k***.

If the summed capacitance of the further capacitive element and the capacitive element of the other DAC cell is different from a capacitance of the capacitive element 511 of the DAC cell **510-*i*, 510-*j* or 510-*k*, a ratio of a summed resistance of the resistive elements of the other DAC cell to the summed resistance of the resistive elements of the DAC cell 510-*i*, 510-*j* or 510-*k* may be proportional to a ratio of the capacitance of the capacitive element of the DAC cell 510-*i*, 510-*j* or 510-*k*** to the summed capacitance of the further capacitive element and the capacitive element of the other DAC cell. In other words, the ratio of resistances in the DAC cells may be inversely proportional to the ratio of the summed capacitance of the DAC cells.

Similarly to what is described above in connection with FIG. 4, each of the DACs 500, 600 and 700 may comprise DAC cells comprising only a single capacitive element but with different capacitances. If the capacitive element of another DAC cell exhibits a capacitance different from a capacitance of the capacitive element 511 of one of the DAC cells **510-*i*, 510-*j* and 510-*k*, the summed resistances of the DAC cells may be inversely proportional to the summed capacitances of the DAC cells. In other words, a ratio of a summed resistance of the resistive elements of the other DAC cell to the summed resistance of the resistive elements of the DAC cell 510-*i*, 510-*j* or 510-*k* may be proportional to a ratio of the capacitance of the capacitive element of the DAC cell 510-*i*, 510-*j* or 510-*k*** to the capacitance of the capacitive element of the other DAC cell.

For example, the DAC cell **510-*i*, 510-*j* or 510-*k*** may be used as a thermometer coded DAC cell and the other DAC cell may be used as a binary coded DAC cell in a DAC according to the proposed architecture.

The exemplary DACs 500, 600 and 700 described above in connection with FIGS. 5 to 7 are single-ended DAC implementations. According to the proposed architecture, the DACs 500, 600 and 700 may optionally be implemented differentially. If implemented differentially, the respective DAC cell **510-*i*, 510-*j* or 510-*k* may further comprise a second capacitive element configured to generate a second analog cell output signal based on a second drive signal, and a second driver circuit configured to generate the second drive signal. The second drive signal is inverted with respect to the drive signal. Further, the respective DAC cell 510-*i*, 510-*j* or 510-*k*** may comprise a third and a fourth resistive element exhibiting the same summed resistance as the first and the second resistive element.

In the differential DAC cell **510-*i***, the third resistive element may be coupled between the second driver circuit and the second capacitive element, and the fourth resistive element may be coupled between the second capacitive element and a second output node of the DAC.

In the differential DAC cell **510-*j***, the second driver circuit may comprise at least two transistors (of different conductivity) serially coupled between the first potential and the second potential. An output node of the second driver circuit may be coupled between the at least two transistors of the second driver circuit. Accordingly, the third resistive element may be coupled between the output node of the second driver circuit and the first one of the at least two transistors of the second driver circuit. The fourth resistive element may be coupled between the output node of the second driver circuit and the second one of the at least two transistors of the second driver circuit.

In the differential DAC cell **510-*k***, the third resistive element may be coupled between the first potential and a first one of the at least two transistors of the second driver circuit, and the fourth resistive element may be coupled between the second potential and a second one of the at least two transistors of the second driver circuit.

Accordingly, a differential pair of analog output signals with high linearity may be generated at the DAC output nodes.

Figure 8:
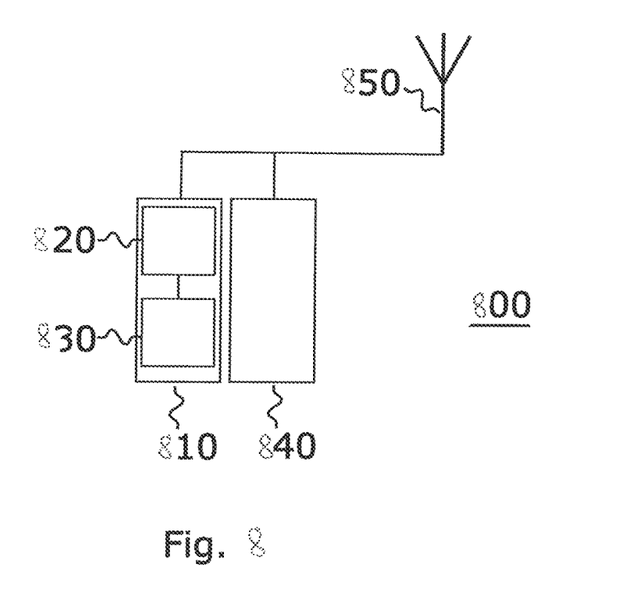
FIG. 8 illustrates an example of a base station.

An example of an implementation using a DAC according to one or more aspects of the architecture described above or one or more examples described above is illustrated in FIG. 8. FIG. 8 schematically illustrates an example of a radio base station 800 (e.g. for a femtocell, a picocell, a microcell or a macrocell) comprising a DAC 820 as proposed.

The DAC 820 is part of a transmitter 810. The transmitter 810 additionally comprises digital circuitry 830 (e.g. a Digital Signal Processor, DSP) configured to supply digital data as input to the DAC 820. For example, the digital circuitry 830 may be configured to generate the digital data based on data to be wirelessly transmitted.

Further, the base station 800 comprises at least one antenna element 850 coupled to the transmitter 810 for radiating one or more Radio Frequency (RF) transmit signals that are based on the DAC output to the environment. For example, the DAC 820 may be coupled to the antenna element 850 via one or more intermediate elements such as a filter, an up-converter (mixer) or a PA.

Additionally, the base station 800 comprises a receiver 840 configured to receive a RF receive signal from the antenna element 850 or another antenna element (not illustrated) of the base station 800.

To this end, a base station enabling direct generation of an RF transmit signal with improved Adjacent Channel Leakage Ratio (ACLR) and low Error Vector Magnitude (EVM) may be provided.

The base station 800 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit (I²C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 9:
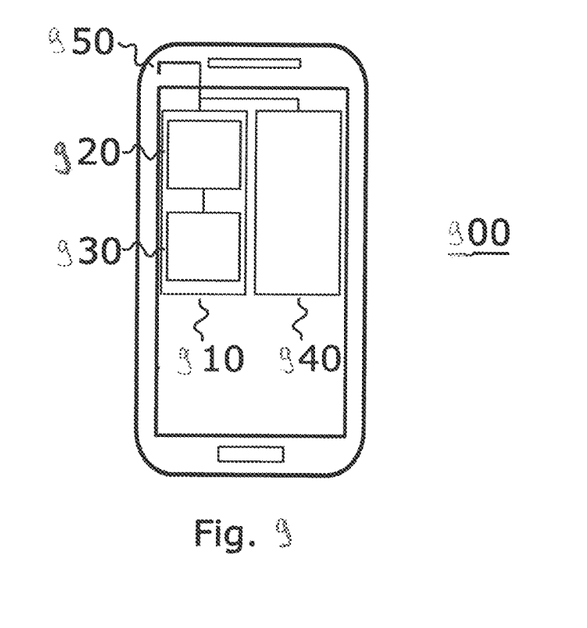
FIG. 9 illustrates an example of a mobile device.

Another example of an implementation using a DAC according to one or more aspects of the architecture described above or one or more examples described above is illustrated in FIG. 9. FIG. 9 schematically illustrates an example of a mobile device 900 (e.g. mobile phone, smartphone, tablet-computer, or laptop) comprising a DAC 920 as proposed.

The DAC 920 is part of a transmitter 910. The transmitter 910 additionally comprises digital circuitry 930 (e.g. a DSP) configured to supply digital data as input to the DAC 920. For example, the digital circuitry 930 may be configured to generate the digital data based on data to be wirelessly transmitted.

Further, the mobile device 900 comprises at least one antenna element 950 coupled to the transmitter 910 for radiating one or more RF transmit signals that are based on the DAC output to the environment. For example, the DAC 920 may be coupled to the antenna element 950 via one or more intermediate elements such as a filter, an up-converter (mixer) or a PA.

Additionally, the mobile device 900 comprises a receiver 940 configured to receive a RF receive signal from the antenna element 950 or another antenna element (not illustrated) of the mobile device 900.

To this end, a mobile device enabling direct generation of an RF transmit signal with improved ACLR and low EVM may be provided.

The mobile device 900 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I$^2$C or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using digital-to-analog conversion according to the proposed architecture or one or more of the examples described above may be configured to operate according to one of the 3GPP-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is a DAC comprising a plurality of DAC cells coupled to an output node of the DAC, wherein at least one of the plurality of DAC cells comprises: a capacitive element configured to generate an analog cell output signal based on a drive signal; a driver circuit configured to generate the drive signal; and a resistive element exhibiting a resistance of at least 20Ω, wherein the resistive element is coupled between the driver circuit and the capacitive element or between the capacitive element and the output node.

Example 2 is the DAC of example 1, wherein the resistance of the resistive element is at least 100Ω.

Example 3 is the DAC of example 1 or example 2, wherein the resistive element is a thin film resistor.

Example 4 is the DAC of example 1 or example 2, wherein the resistive element is a polysilicon resistor.

Example 5 is the DAC of example 1 or example 2, wherein the resistive element is a metal resistor.

Example 6 is the DAC of any of examples 1 to 5, wherein the at least one of the plurality of DAC cells further comprises: a second capacitive element configured to generate a second analog cell output signal based on a second drive signal; a second driver circuit configured to generate the second drive signal, wherein the second drive signal is inverted with respect to the drive signal; and a second resistive element coupled between the second driver circuit and the second capacitive element or between the second capacitive element and a second output node of the DAC, wherein a resistance of the second resistive element is equal to the resistance of the resistive element.

Example 7 is the DAC of any of examples 1 to 6, wherein in comparison to the at least one of the plurality of DAC cells another one of the plurality of DAC cells additionally comprises: a further capacitive element coupled between a first node at ground potential and a second node arranged between the driver circuit and the capacitive element of the other one of the plurality of DAC cells, wherein a summed capacitance of the further capacitive element and the capacitive element of the other one of the plurality of DAC cells is equal to a capacitance of the capacitive element of the at least one of the plurality of DAC cells.

Example 8 is the DAC of example 7, wherein the resistance of the resistive element of the other one of the plurality of DAC cells is equal to the resistance of the resistive element of the at least one of the plurality of DAC cells.

Example 9 is the DAC of any of examples 1 to 6, wherein, in comparison to the at least one of the plurality of digital-to-analog converter cells, the capacitive element of another one of the plurality of DAC cells exhibits a capacitance different from a capacitance of the capacitive element of the at least one of the plurality of DAC cells, and wherein a ratio of a resistance of the resistive element of the other one of the plurality of DAC cells to the resistance of the resistive element of the at least one of the plurality of DAC cells is equal to a ratio of the capacitance of the capacitive element of the at least one of the plurality of DAC cells to the capacitance of the capacitive element of the other one of the plurality of DAC cells.

Example 10 is a DAC comprising a plurality of DAC cells coupled to an output node of the DAC, wherein at least one of the plurality of DAC cells comprises: a capacitive element configured to generate an analog cell output signal based on a drive signal; a driver circuit configured to generate the drive signal; and a first and a second resistive element exhibiting a summed resistance of at least 20Ω, wherein: the first resistive element is coupled between the driver circuit and the capacitive element, and the second resistive element is coupled between the capacitive element and the output node; or the driver circuit comprises at least two transistors serially coupled between a first potential and a second potential, the first resistive element is coupled between the first potential and a first one of the at least two transistors, and the second resistive element is coupled between the second potential and a second one of the at least two transistors; or an output node of the driver circuit is coupled between the at least two transistors, the first resistive element is coupled between the output node of the driver circuit and the first one of the at least two transistors, and the second resistive element is coupled between the output node of the driver circuit and the second one of the at least two transistors.

Example 11 is the DAC of example 10, wherein each of the first and the second resistive element exhibits a resistance of at least 10Ω.

Example 12 is the DAC of example 10 or example 11, wherein the first and the second resistive element exhibit the same resistance.

Example 13 is the DAC of any of examples 10 to 12, wherein the summed resistance of the first and the second resistive element is at least 100Ω.

Example 14 is the DAC of any of examples 10 to 13, wherein at least one of the first and the second resistive element is a thin film resistor.

Example 15 is the DAC of any of examples 10 to 13, wherein at least one of the first and the second resistive element is a polysilicon resistor.

Example 16 is the DAC of any of examples 10 to 13, wherein at least one of the first and the second resistive element is a metal resistor.

Example 17 is the DAC of any of examples 10 to 16, wherein the at least one of the plurality of DAC cells further comprises: a second capacitive element configured to generate a second analog cell output signal based on a second drive signal; a second driver circuit configured to generate the second drive signal, wherein the second drive signal is inverted with respect to the drive signal; and a third and a fourth resistive element exhibiting the same summed resistance as the first and the second resistive element, wherein: the third resistive element is coupled between the second driver circuit and the second capacitive element, and the fourth resistive element is coupled between the second capacitive element and a second output node of the DAC; or the second driver circuit comprises at least two transistors serially coupled between the first potential and the second potential, the third resistive element is coupled between the first potential and a first one of the at least two transistors of the second driver circuit, and the fourth resistive element is coupled between the second potential and a second one of the at least two transistors of the second driver circuit; or an output node of the second driver circuit is coupled between the at least two transistors of the second driver circuit, the third resistive element is coupled between the output node of the second driver circuit and the first one of the at least two transistors of the second driver circuit, and the fourth resistive element is coupled between the output node of the second driver circuit and the second one of the at least two transistors of the second driver circuit.

Example 18 is the DAC of any of examples 10 to 17, wherein in comparison to the at least one of the plurality of DAC cells another one of the plurality of DAC cells additionally comprises: a further capacitive element coupled between a first node at ground potential and a second node arranged between the driver circuit and the capacitive element of the other one of the plurality of DAC cells, wherein a summed capacitance of the further capacitive element and the capacitive element of the other one of the plurality of DAC cells is equal to a capacitance of the capacitive element of the at least one of the plurality of DAC cells.

Example 19 is the DAC of example 18, wherein a summed resistance of the resistive elements of the other one of the plurality of DAC cells is equal to the summed resistance of the resistive elements of the at least one of the plurality of DAC cells.

Example 20 is the DAC of any of examples 10 to 17, wherein the capacitive element of another one of the plurality of DAC cells exhibits a capacitance different from a capacitance of the capacitive element of the at least one of the plurality of DAC cells, and wherein a ratio of a summed resistance of the resistive elements of the other one of the plurality of DAC cells to the summed resistance of the resistive elements of the at least one of the plurality of DAC cells is proportional to a ratio of the capacitance of the capacitive element of the at least one of the plurality of DAC cells to the capacitance of the capacitive element of the other one of the plurality of DAC cells.

Example 21 is a transmitter, comprising: a DAC according to any of examples 1 to 20; and digital circuitry configured to supply digital data as input to the DAC.

Example 22 is the transmitter of example 22, wherein the digital circuitry is configured to generate the digital data based on data to be wirelessly transmitted.

Example 23 is a mobile device, comprising: a transmitter according to example 21 or example 22; and at least one antenna element coupled to the transmitter.

Example 24 is the mobile device of example 23, further comprising a receiver configured to receive a radio frequency receive signal from the antenna element.

Example 25 is a base station, comprising: a transmitter according to example 21 or example 22; and at least one antenna element coupled to the transmitter.

Example 26 is the base station of example 25, further comprising a receiver configured to receive a radio frequency receive signal from the antenna element.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include DSP hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog converter comprising a plurality of digital-to-analog converter cells coupled to an output node of the digital-to-analog converter, wherein at least one of the plurality of digital-to-analog converter cells comprises:
   a capacitive element configured to generate an analog cell output signal based on a drive signal;
   a driver circuit configured to generate the drive signal; and
   a resistive element exhibiting a resistance of at least 20Ω, wherein the resistive element is coupled in series between the driver circuit and the capacitive element or between the capacitive element and the output node.

2. The digital-to-analog converter of claim 1, wherein the resistance of the resistive element is at least 100Ω.

3. The digital-to-analog converter of claim 1, wherein the resistive element is a thin film resistor.

4. The digital-to-analog converter of claim 1, wherein the resistive element is a polysilicon resistor.

5. The digital-to-analog converter of claim 1, wherein the resistive element is a metal resistor.

6. The digital-to-analog converter of claim 1, wherein the at least one of the plurality of digital-to-analog converter cells further comprises:
   a second capacitive element configured to generate a second analog cell output signal based on a second drive signal;
   a second driver circuit configured to generate the second drive signal, wherein the second drive signal is inverted with respect to the drive signal; and
   a second resistive element coupled between the second driver circuit and the second capacitive element or between the second capacitive element and a second output node of the digital-to-analog converter, wherein a resistance of the second resistive element is equal to the resistance of the resistive element.

7. The digital-to-analog converter of claim 1, wherein in comparison to the at least one of the plurality of digital-to-analog converter cells another one of the plurality of digital-to-analog converter cells additionally comprises:
   a further capacitive element coupled between a first node at ground potential and a second node arranged between the driver circuit and the capacitive element of the other one of the plurality of digital-to-analog converter cells,
   wherein a summed capacitance of the further capacitive element and the capacitive element of the other one of the plurality of digital-to-analog converter cells is equal to a capacitance of the capacitive element of the at least one of the plurality of digital-to-analog converter cells.

8. The digital-to-analog converter of claim 7, wherein the resistance of the resistive element of the other one of the plurality of digital-to-analog converter cells is equal to the resistance of the resistive element of the at least one of the plurality of digital-to-analog converter cells.

9. The digital-to-analog converter of claim 1, wherein, in comparison to the at least one of the plurality of digital-to-analog converter cells, the capacitive element of another one of the plurality of digital-to-analog converter cells exhibits a capacitance different from a capacitance of the capacitive element of the at least one of the plurality of digital-to-analog converter cells, and wherein a ratio of a resistance of the resistive element of the other one of the plurality of digital-to-analog converter cells to the resistance of the resistive element of the at least one of the plurality of digital-to-analog converter cells is equal to a ratio of the capacitance of the capacitive element of the at least one of the plurality of digital-to-analog converter cells to the capacitance of the capacitive element of the other one of the plurality of digital-to-analog converter cells.

10. A transmitter, comprising:
    the digital-to-analog converter according to claim 1; and
    digital circuitry configured to supply digital data as input to the digital-to-analog converter.

11. The transmitter of claim 10, wherein the digital circuitry is configured to generate the digital data based on data to be wirelessly transmitted.

12. A base station, comprising:
    the transmitter according to claim 10; and
    at least one antenna element coupled to the transmitter.

13. The base station of claim 12, further comprising a receiver configured to receive a radio frequency receive signal from the antenna element.

14. A digital-to-analog converter comprising a plurality of digital-to-analog converter cells coupled to an output node of the digital-to-analog converter, wherein at least one of the plurality of digital-to-analog converter cells comprises:
    a capacitive element configured to generate an analog cell output signal based on a drive signal;
    a driver circuit configured to generate the drive signal, wherein the capacitive element is coupled between the driver circuit and the output node of the digital-to-analog converter; and
    a first resistive element and a second resistive element exhibiting a summed resistance of at least 20Ω, wherein:
    the first resistive element is coupled between the driver circuit and the capacitive element, and the second resistive element is coupled between the capacitive element and the output node; or
    the driver circuit comprises at least two transistors serially coupled between a first potential and a second potential, the first resistive element is coupled between the first potential and a first one of the at least two transistors, and the second resistive element is coupled between the second potential and a second one of the at least two transistors; or
    the driver circuit comprises at least two transistors serially coupled between a first potential and a second potential, an output node of the driver circuit is coupled between the at least two transistors, the first resistive element is coupled between the output node of the driver circuit and the first one of the at least two transistors, and the second resistive element is coupled between the output node of the driver circuit and the second one of the at least two transistors.

15. The digital-to-analog converter of claim 14, wherein each of the first resistive element and the second resistive element exhibits a resistance of at least 10Ω.

16. The digital-to-analog converter of claim 14, wherein the first resistive element and the second resistive element exhibit the same resistance.

17. The digital-to-analog converter of claim 14, wherein the summed resistance of the first resistive element and the second resistive element is at least 100Ω.

18. The digital-to-analog converter of claim 14, wherein at least one of the first resistive element and the second resistive element is a thin film resistor.

19. The digital-to-analog converter of claim 14, wherein at least one of the first resistive element and the second resistive element is a polysilicon resistor.

20. The digital-to-analog converter of claim 14, wherein at least one of the first resistive element and the second resistive element is a metal resistor.

21. The digital-to-analog converter of claim 14, wherein the at least one of the plurality of digital-to-analog converter cells further comprises:
    a second capacitive element configured to generate a second analog cell output signal based on a second drive signal;
    a second driver circuit configured to generate the second drive signal, wherein the second drive signal is inverted with respect to the drive signal; and
    a third resistive element and a fourth resistive element exhibiting the same summed resistance as the first resistive element and the second resistive element, wherein:
    the third resistive element is coupled between the second driver circuit and the second capacitive element, and the fourth resistive element is coupled between the second capacitive element and a second output node of the digital-to-analog converter; or the second driver circuit comprises at least two transistors serially coupled between the first potential and the second potential, the third resistive element is coupled between the first potential and a first one of the at least two transistors of the second driver circuit, and the fourth resistive element is coupled between the second potential and a second one of the at least two transistors of the second driver circuit; or the second driver circuit comprises at least two transistors serially coupled between the first potential and the second potential, an output node of the second driver circuit is coupled between the at least two transistors of the second driver circuit, the third resistive element is coupled between the output node of the second driver circuit and the first one of the at least two transistors of the second driver circuit, and the fourth resistive element is coupled between the output node of the second driver circuit and the second one of the at least two transistors of the second driver circuit.

22. The digital-to-analog converter of claim 14, wherein in comparison to the at least one of the plurality of digital-to-analog converter cells another one of the plurality of digital-to-analog converter cells additionally comprises:

a further capacitive element coupled between a first node at ground potential and a second node arranged between the driver circuit and the capacitive element of the other one of the plurality of digital-to-analog converter cells, wherein a summed capacitance of the further capacitive element and the capacitive element of the other one of the plurality of digital-to-analog converter cells is equal to a capacitance of the capacitive element of the at least one of the plurality of digital-to-analog converter cells.

23. The digital-to-analog converter of claim 22, wherein a summed resistance of resistive elements of the other one of the plurality of digital-to-analog converter cells is equal to the summed resistance of the first and second resistive elements of the at least one of the plurality of digital-to-analog converter cells.

24. The digital-to-analog converter of claim 14, wherein the capacitive element of another one of the plurality of digital-to-analog converter cells exhibits a capacitance different from a capacitance of the capacitive element of the at least one of the plurality of digital-to-analog converter cells, and wherein a ratio of a summed resistance of the resistive elements of the other one of the plurality of digital-to-analog converter cells to the summed resistance of the resistive elements of the at least one of the plurality of digital-to-analog converter cells is proportional to a ratio of the capacitance of the capacitive element of the at least one of the plurality of digital-to-analog converter cells to the capacitance of the capacitive element of the other one of the plurality of digital-to-analog converter cells.

25. A transmitter, comprising:

the digital-to-analog converter according to claim 14; and digital circuitry configured to supply digital data as input to the digital-to-analog converter.

\* \* \* \* \*